United States Patent
Bouras et al.

[11] Patent Number: 6,144,257
[45] Date of Patent: *Nov. 7, 2000

[54] BUS CONTROL BUFFER AMPLIFIER

[75] Inventors: Ilias Bouras, Athens, Greece; Constantin Papadas; Jean-Pierre Moreau, both of Gieres, France

[73] Assignee: SGS-Thomson Microelectronics S.A., Gentilly, France

[*] Notice: This patent issued on a continued prosecution application filed under 37 CFR 1.53(d), and is subject to the twenty year patent term provisions of 35 U.S.C. 154(a)(2).

[21] Appl. No.: 09/028,408

[22] Filed: Feb. 24, 1998

[30] Foreign Application Priority Data

Feb. 25, 1997 [FR] France .................. 97 02459

[51] Int. Cl.⁷ ...................................... H03F 3/16
[52] U.S. Cl. .................. 330/277; 330/269; 327/374
[58] Field of Search ................ 330/269, 277; 327/333, 374, 375, 111, 112, 391, 376

[56] References Cited

U.S. PATENT DOCUMENTS

| | | | |
|---|---|---|---|
| 3,806,738 | 4/1974 | Chin et al. | 307/228 |
| 4,042,839 | 8/1977 | Araki | 307/270 |
| 4,071,783 | 1/1978 | Knepper | 307/270 |
| 4,199,695 | 4/1980 | Cook et al. | 307/269 |
| 4,542,310 | 9/1985 | Ellis et al. | 307/578 |
| 4,714,840 | 12/1987 | Proebsting | 307/443 |
| 5,191,244 | 3/1993 | Runaldue et al. | 307/475 |
| 5,382,846 | 1/1995 | Shigehara et al. | 326/68 |
| 5,422,591 | 6/1995 | Rastegar et al. | 327/409 |

OTHER PUBLICATIONS

French Search Report from French Patent Application 97 02459, filed Feb. 25, 1997.

*Primary Examiner*—Robert Pascal
*Assistant Examiner*—Henry Choe
*Attorney, Agent, or Firm*—Wolf, Greenfield & Sacks, P.C.; James H. Morris; Theodore E. Galanthay

[57] ABSTRACT

The present invention relates to a bus control buffer amplifier. The output terminal is associated with a first pull-down N-channel MOS transistor and with a second pull-up N-channel MOS transistor. The first N-channel MOS transistor is directly controlled by an input signal. The second MOS transistor is an N-channel transistor, and its gate is controlled by a third pull-down N-channel MOS transistor directly controlled by the input signal, and by a fourth pull-up N-channel MOS transistor, which is controlled by the inverted input signal. The fourth N-channel MOS transistor has a very abrupt drain-substrate junction.

23 Claims, 4 Drawing Sheets

BUS CONTROL BUFFER AMPLIFIER

BACKGROUND OF THE INVENTION

1. Field of the Invention

The present invention relates to the field of integrated circuits and more specifically to the implementation of buffer amplifiers in MOS-type integrated circuits.

2. Discussion of the Related Art

Generally, in an integrated circuit, the state of several primary components connected to a common line or bus has to be controlled based on logic signals. For this purpose, buffer amplifiers, the function of which is to adapt the impedance of the logic signal to the bus to be controlled, are used. In the case where it is desired to implement this type of control in a very fast way and where there may be a relatively large number of devices to be controlled, the aggregate capacitance of all of the devices can be high.

FIG. 1 shows a current type of buffer amplifier used in MOS technology. This buffer amplifier includes a single inverter including two P-channel and N-channel complementary MOS transistors, respectively, P1 and N1, connected in series between a high supply potential Vdd and the ground. The gates of transistors P1 and N1 are connected together to an input terminal E, and the common drain of transistors P1 and N1 is connected to an output terminal S. The equivalent load of the line or bus connected to terminal S has also been shown in the drawing in the form of a capacitor $C_L$.

When the input signal is at the low level, the voltage on output terminal S is at the high level, and conversely. This primary buffer amplifier exhibits, as is well known, the disadvantage of being poorly adapted to high frequency operation. This is essentially due to the presence of a P-channel MOS transistor which is intrinsically slower than an N-channel MOS transistor. Thus, the transitions of the output from the low level to the high level necessarily have a reduced speed. This is all the more disturbing as the load connected to the output terminal is highly capacitive.

To overcome this disadvantage, P-channel MOS transistors having larger dimensions are used in order to supply a control current of greater amplitude on the output line. Of, course, this solution goes against the general objective of reduction of the dimensions of semiconductor devices and of the integrated circuits which contain them.

A second solution consists of separating the line connected to terminal S into a number of lines and using a buffer amplifier for each line. This solution of course results in an increase of the general dimension of the circuit.

Thus, the two solutions conventionally put forward lead to an increase of the dimension of the integrated circuit, which is itself a disadvantage. In addition, the fact that the input capacitance of the buffer amplifier increases with the dimensions or the number of transistors that it contains is also a disadvantage. Accordingly, the upstream circuits meant to supply input signal E are also adversely affected.

Of course, it has also been conventionally attempted to implement various more complex circuits replacing the primary circuit of FIG. 1, but the major disadvantages described hereabove (larger dimensions, limited speed of switching to the high state, and high input capacitance) are not basically solved.

As a consequence, conventionally, when it is desired to control, at high speed, a bus likely to be highly capacitive, bipolar-type integrated circuits or bipolar and MOS mixed technology integrated circuits are used.

SUMMARY OF THE INVENTION

An object of the present invention is to provide a buffer amplifier having high switching speed implemented in MOS technology.

Another object of the present invention is to provide a buffer amplifier having a low input capacitance.

Another object of the present invention is to provide a buffer amplifier able to control a line likely to be capacitive.

Another object of the present invention is to provide a buffer amplifier that optimizes the relationship between the area occupied in the integrated circuit and the power required to be delivered.

These objects as well as others are achieved by a bus control buffer amplifier, including an input terminal and an output terminal connected to the output line, the output terminal being associated with a first pull-down N-channel MOS transistor and to a second pull-up N-channel MOS transistor, the first N-channel MOS transistor being directly controlled by an input signal. In this buffer amplifier, the second MOS transistor is an N-channel transistor, and its gate is controlled by a third pull-down N-channel MOS transistor directly controlled by the input signal, and by a fourth pull-up N-channel MOS transistor, which is controlled by the inverted input signal; and the fourth N-channel MOS transistor includes a very abrupt drain-substrate junction.

According to an embodiment of the present invention, the substrate of the fourth N-channel MOS transistor is a floating substrate.

According to an embodiment of the present invention, the buffer amplifier is implemented in submicron technology.

According to an embodiment of the present invention, the substrate of the second N-channel MOS transistor is a floating substrate.

According to an embodiment of the present invention, the second N-channel MOS transistor has the same dimensions as the first N-channel MOS transistor.

According to an embodiment of the present invention, the fourth transistor is defined so that the surface area of the fourth transistor is three times smaller than that of the second transistor.

According to an embodiment of the present invention, the fourth transistor is defined so that the channel length of the fourth transistor is equal to six times that of the third transistor.

The foregoing objects, features and advantages of the present invention, will be discussed in detail in the following non-limiting description of specific embodiments, in connection with the accompanying drawings.

DETAILED DESCRIPTION

Figure 2:
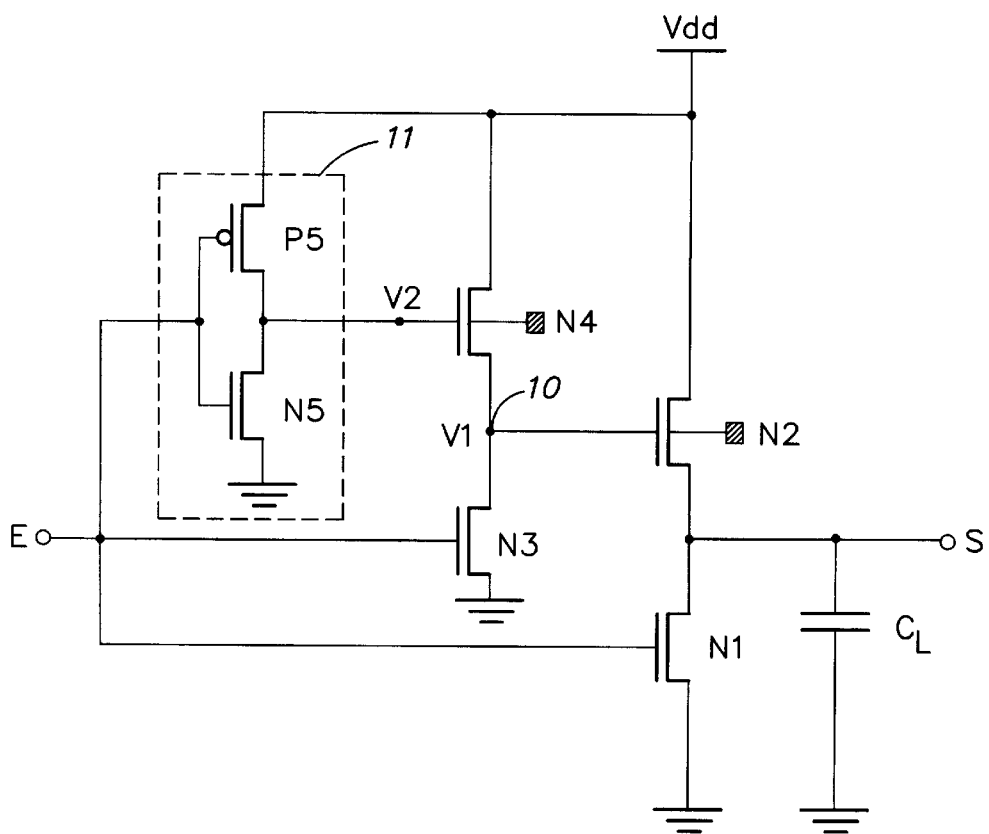
FIG. 2 shows a buffer amplifier according to the present invention.

FIG. 2 shows a buffer amplifier according to the present invention. This buffer amplifier is connected between an input terminal E and an output terminal S connected to a capacitance load $C_L$. Output terminal S is connected to the drain of an N-channel MOS transistor N1 and to the source of an N-channel MOS transistor N2. The source of transistor N1 is connected to the ground, and the drain of transistor N2 is connected to a supply voltage Vdd. Similarly, N-channel MOS transistors N3 and N4 are connected in series between the ground and high supply voltage Vdd. The connection node 10 of transistors N3 and N4 is connected to the gate of transistor N2.

The gates of transistors N1 and N3 are directly connected to input terminal E. The gate of transistor N4 is connected to input terminal E via an inverter 11. Inverter 11 includes for example, conventionally, a P-channel MOS transistor P5 and an N-channel MOS transistor N5 in series between supply source Vdd and the ground.

When a high level input signal is applied on input terminal E, transistors N1 and N3 are conducting, and transistor N4 is non-conducting. Accordingly, transistor N2 is non-conducting. Thus, output terminal S is grounded via transistor N1 through which capacitor $C_L$ discharges.

When the input signal on terminal E is switched to the low level, transistors N1 and N3 are non-conducting and transistor N4 turns on, which turns on transistor N2 and tends to set terminal S to the high level, that is, capacitor $C_L$ starts to charge.

This circuit has, a priori, the disadvantage that the high level on terminal S is limited. Indeed, voltage V1 on the gate of transistor N2 is normally equal to Vdd minus the threshold voltage of transistor N4. Thus, a maximum voltage equal to the voltage on the gate of transistor N2 minus the threshold voltage of transistor N2, that is, a voltage substantially equal to Vdd-$V_{TH4}$-$V_{TH2}$ where $V_{TH4}$ and $V_{TH2}$ designate threshold voltages of transistors N4 and N2, is obtained on terminal S.

Thus, the circuit according to the present invention seems to exhibit a disadvantage with respect to the circuit of prior art since the high supply voltage is limited, which disadvantage is particularly serious when the supply voltages are low, and it is now the tendency of integrated circuits to use lower and lower high supply voltages, for example on the order of 3 V.

To solve this problem, the present invention not only uses the previously-described circuit but also implements this circuit and especially transistor N4 in a specific technology.

Figure 3:
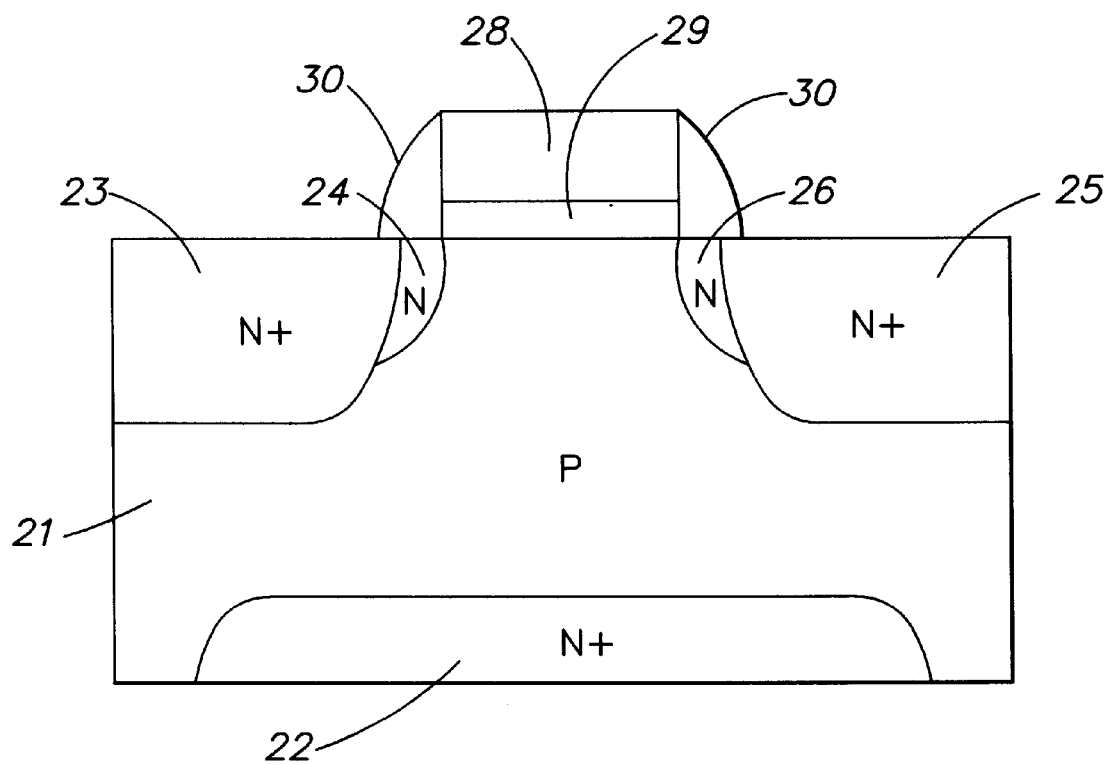
FIG. 3 is a cross-sectional view of an N-channel MOS transistor used in the circuit of FIG. 2.

FIG. 3 schematically shows a cross-sectional view of a conventional MOS transistor formed in a semiconductor substrate 21 of type P above a buried layer 22 of type N$^+$. This transistor includes a highly-doped N-type source region 23 and a source extension region 24 as well as a highly-doped N-type drain region 25 and a drain extension region 26. A gate 28 is formed above a gate insulating layer 29 and is surrounded with spacers 30.

The present invention uses for the circuit transistors, and especially for transistor N4, MOS transistors implemented in submicron technology (in which the length of the gates is lower than 0.5 μm). A specific characteristic of such a technology is that the drain and source areas are heavily-doped and shallow, that is, the junction between the drain or the source and the substrate is very abrupt. A very abrupt junction is a junction wherein the level of the highest doped region remains high very close to the junction.

Figure 1:
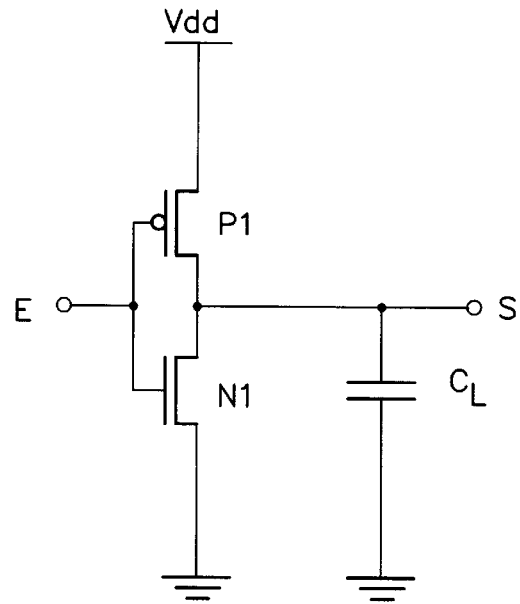
FIG. 1 shows an example of conventional buffer amplifier.

As a result, as concerns the operation of the circuit of FIG. 2, when a gate pulse is applied to transistor N4, this transistor turns on and the capacitors present at node 10 (source capacitor of transistor N4, drain capacitor of transistor N3, gate capacitor of transistor N2) charge to a potential Vdd-$V_{TH4}$. Then, transistor N4 becomes non-conducting again and the charges on node 10 can no longer discharge since transistor N3 has been blocked by the pulse which has turned on transistor N4. A depletion area (isolating), all the larger as the junctions are abrupt, forms under the source of transistor N4 and under the drain of transistor N3. As a result, the capacitances of the source of transistor N4 and of the drain of transistor N3, and thus, the general capacitance of node 10, decrease. Since the charges are conserved, the voltage on node 10 tends to increase and reaches a value higher than voltage Vdd. Transistor N2 is thus optimally controlled and the high level on terminal S is at least equal to that which is obtained with the inverter circuit of FIG. 1.

According to the inventors, this phenomenon is stronger if transistor N4 has a floating substrate.

Figure 4:
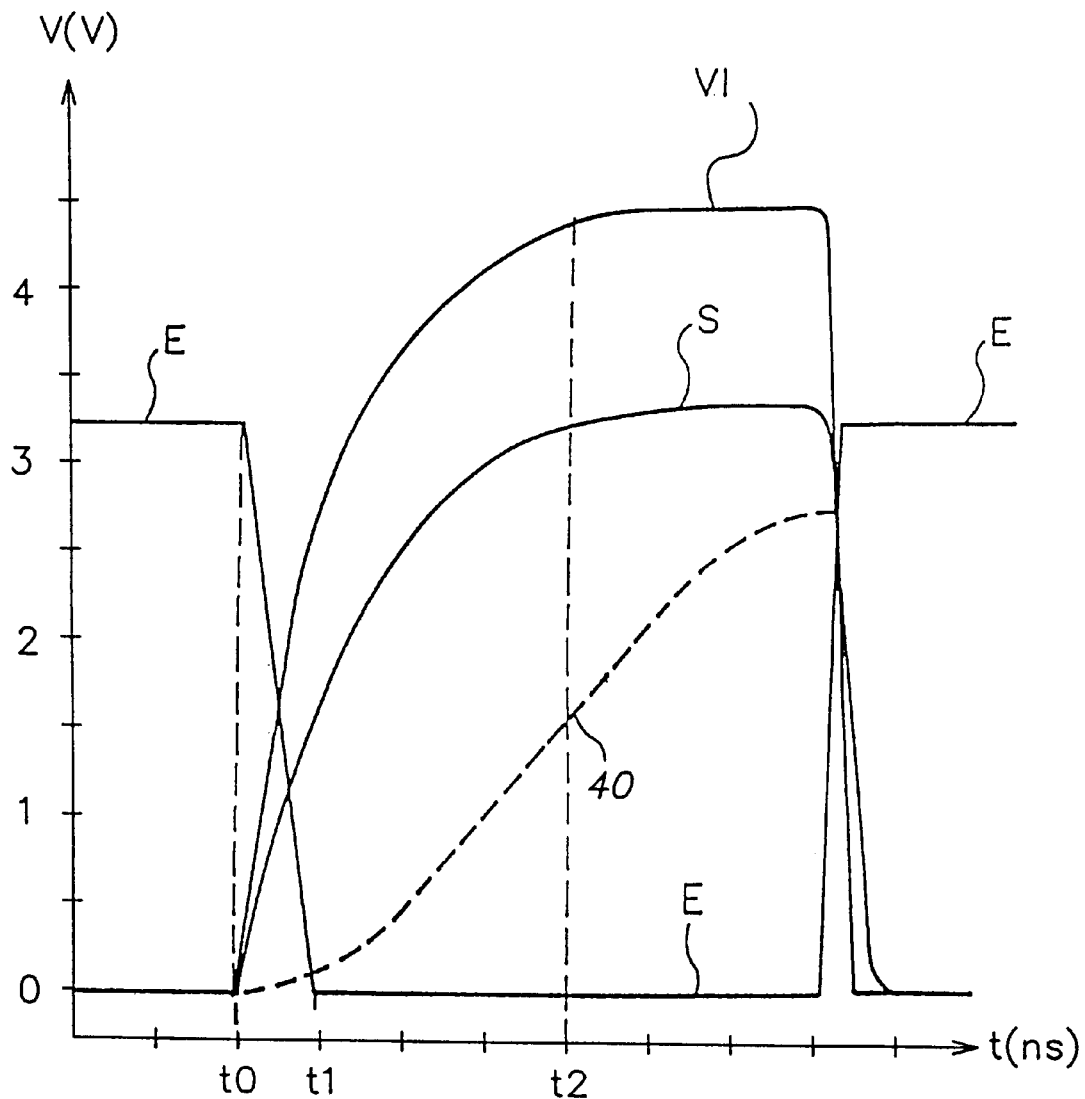
FIG. 4 illustrates the variations in time of voltages characteristic of the circuit of FIG. 2.

Whatever the theoretical explanation, the result illustrated in FIG. 4 can be observed. In this drawing, the variations according to time of the voltage on terminal E, of the voltage on terminal S and of voltage V1 on node 10, have been illustrated. In the initial state, the voltage on input terminal E is high and the voltage on output terminal S is low. It is assumed that between times t0 and t1, the voltage on input terminal E switches from the high level to the low level. Thus, voltage V1 on node 10 starts to increase and, as indicated previously, increases to a level higher than the supply voltage. Accordingly, the voltage on output terminal S can reach a level very close to voltage Vdd.

Further, it should be noted that in the absence of the previously-described phenomenon, output voltage V1 would have followed the shape illustrated by curve 40.

Figure 5:
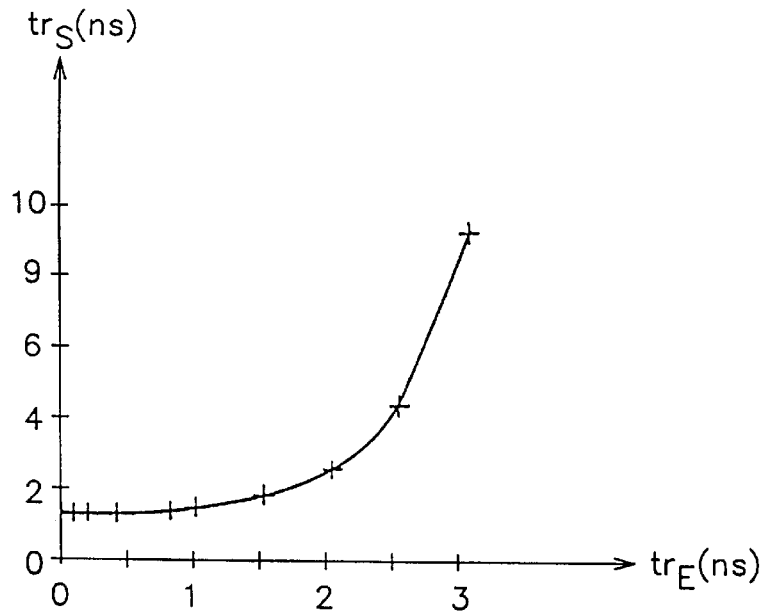
FIG. 5 illustrates the relation between the output signal rise time and the input signal rise time for the circuit of FIG. 2.

FIG. 5 illustrates the relation between the rise time of the output signal ($tr_S$) and the rise time of the input signal ($tr_E$) for the buffer amplifier circuit according to the present invention. The rise time of the output signal slowly increases for low rise times of the input signal (lower than 2 ns), then abruptly decreases. This shows that the overvoltage effect on node 10 effectively occurs for input signals with a very fast increase.

Figure 6:
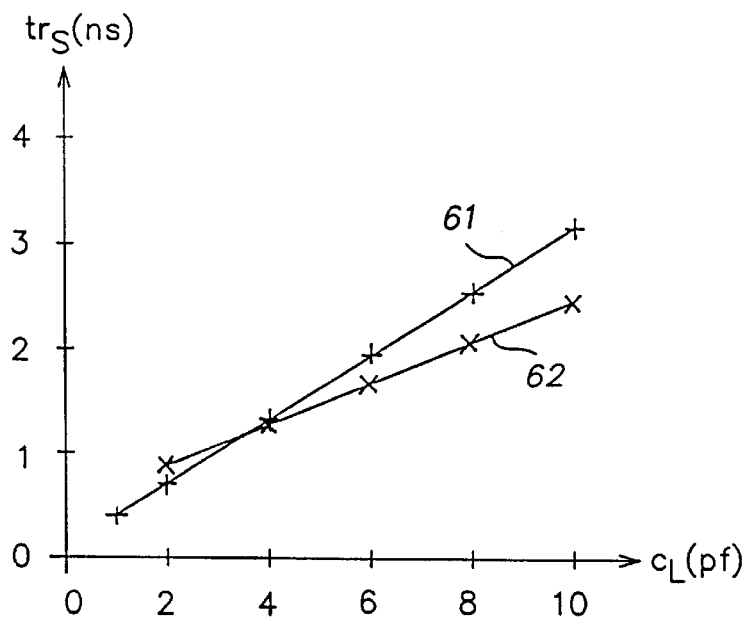
FIG. 6 illustrates the relation between the output signal rise time and the output capacitive load for a conventional circuit and for the circuit of FIG. 2.

FIG. 6 illustrates the relation between the rise time of the output signal ($tr_S$) and the capacitive load for the circuit according to the present invention (curve 61) and for a conventional circuit (curve 62). In both cases, the rise time of the signal varies linearly with capacitance $C_L$. However, the slope is smaller in the case of the circuit according to the present invention. For high capacitances (of approximately 10 pF, for example), the value of the rise time appears to be reduced by approximately 15%. This shows that the device according to the present invention provides a significant improvement of the switching speed for a line with a high capacitive load.

The inventors have also observed that the power consumption of a circuit according to the present invention is not different from that of a conventional circuit. In compliance with the desired objects, the present invention provides a circuit with a low input capacitance since, conversely to the conventional circuit, the P-channel transistor does not directly intervene to charge capacitor $C_L$, and thus no longer requires to be of large size. In practice, a circuit according to the present invention will have an input capacitance reduced by approximately 50% with respect to that of the conventional circuit.

The present invention also provides a circuit having a reduced or minimum surface since, even if the number of components of the circuit according to the present invention is high with respect to that of a conventional circuit, these components can be of small size.

The greatest advantages of the invention are obtained when the output transistors N1 and N2 are N channel MOS transistors. However, even when transistors N1 and N2 are NPN bipolar transistors, the invention still provides advantages. Indeed, while NPN transistors are intrinsically fast switches, the invention adds the advantage of increasing the output voltage swing. Indeed, due to the overvoltage provided by transistor N4 on the control terminal (the base of transistor N2, the high voltage on the output terminal (S) is not lower than the high supply voltage (Vdd), i.e. the base-emitter voltage drop (Vbe) is compensated.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A bus control buffer amplifier, including an input terminal and an output terminal connected to the output line, the output terminal being associated with a first pull-down transistor and a second pull-up transistor, the first transistor being directly controlled by an input signal, wherein:

the second transistor has its gate is controlled by a third pull-down N-channel MOS transistor directly controlled by the input signal, and by a fourth pull-up N-channel MOS transistor, which is controlled by the inverted input signal; and the fourth N-channel MOS transistor includes a very abrupt drain-substrate junction.

2. The buffer amplifier of claim 1, wherein the first and second transistors are N-channel MOS transistors.

3. The buffer amplifier of claim 1, wherein the substrate of the fourth N-channel MOS transistor is a floating substrate.

4. The buffer amplifier of claim 1, implemented in submicronic technology.

5. The buffer amplifier of claim 2, wherein the substrate of the second N-channel MOS transistor is a floating substrate.

6. The buffer amplifier of claim 2, wherein the second N-channel MOS transistor has the same dimensions as the first N-channel MOS transistor.

7. The buffer amplifier of claim 2, wherein the fourth transistor is defined so that the surface area of the fourth transistor is three times smaller than that of the second transistor.

8. The buffer amplifier of claim 2, wherein the fourth transistor is defined so that the channel length of the fourth transistor is equal to six times that of the third transistor.

9. A buffer amplifier comprising:

an input terminal;

an output terminal;

a first transistor coupled to the output terminal and being directly controlled by an input signal from the input terminal;

a second transistor coupled to the output terminal;

said first and second transistors being series connected;

a third transistor coupled to and for controlling said second transistor and also controlled by the input signal from said input terminal; and a fourth transistor coupled to said second transistor and controlled from said input terminal;

said third and fourth transistors being series connected.

10. The buffer amplifier according to claim 9 wherein said first transistor comprises a first pull-down N-channel MOS transistor.

11. The buffer amplifier according to claim 10 wherein said second transistor comprises a second pull-up N-channel MOS transistor.

12. The buffer amplifier according to claim 11 wherein said third transistor comprises a third pull-down N-channel MOS transistor.

13. The buffer amplifier according to claim 12 wherein said fourth transistor comprises a fourth pull-up N-channel MOS transistor.

14. The buffer amplifier according to claim 13 wherein said first and second transistors are series connected between a voltage supply and ground.

15. The buffer amplifier according to claim 14 wherein said third and fourth transistors are series connected between a voltage supply and ground.

16. The buffer amplifier according to claim 15 further including an inverter coupled from the input terminal and for controlling said fourth transistor.

17. The buffer amplifier of claim 9, wherein said first and second transistors are N-channel MOS transistors.

18. The buffer amplifier of claim 9, wherein said fourth transistor comprises a fourth N-channel MOS transistor having a floating substrate.

19. The buffer amplifier of claim 9, wherein said amplifier is implemented in submicronic technology.

20. The buffer amplifier of claim 9, wherein the second transistor comprises a second N-channel MOS transistor having a floating substrate.

21. The buffer amplifier of claim 9, wherein the second transistor comprises a second N-channel MOS transistor has the same dimensions as the first N-channel MOS transistor.

22. The buffer amplifier of claim 9, wherein the fourth transistor is defined so that the surface area of the fourth transistor is three times smaller than that of the second transistor.

23. The buffer amplifier of claim 9, wherein the fourth transistor is defined so that the channel length of the fourth transistor is equal to six times that of the third transistor.

* * * * *